(12) United States Patent
Aoyagi et al.

(10) Patent No.: US 8,987,763 B2
(45) Date of Patent: Mar. 24, 2015

(54) LIGHT EMITTING DEVICE AND METHOD OF MANUFACTURING THE SAME, AND LIGHT EMITTING UNIT

(71) Applicant: Sony Corporation, Tokyo (JP)

(72) Inventors: Hidekazu Aoyagi, Fukuoka (JP); Takahiko Kawasaki, Tokyo (JP); Michinori Shiomi, Tokyo (JP); Katsutoshi Itou, Fukuoka (JP); Makoto Nakashima, Fukuoka (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/743,275

(22) Filed: Jan. 16, 2013

(65) Prior Publication Data

US 2013/0181249 A1 Jul. 18, 2013

(30) Foreign Application Priority Data

Jan. 31, 2012 (JP) ................................. 2012-017660

(51) Int. Cl.
*H01L 33/00* (2010.01)
*H01L 33/62* (2010.01)
*H01L 33/38* (2010.01)
*H01L 33/44* (2010.01)

(52) U.S. Cl.
CPC .............. *H01L 33/62* (2013.01); *H01L 33/385* (2013.01); *H01L 33/44* (2013.01); *H01L 2224/48091* (2013.01)

USPC .............................. 257/98; 257/99; 257/100

(58) Field of Classification Search
USPC ............................................. 257/98, 99, 100
See application file for complete search history.

(56) References Cited

U.S. PATENT DOCUMENTS

| | | | | |
|---|---|---|---|---|
| 7,098,059 | B2 * | 8/2006 | Otoma et al. | 438/28 |
| 8,410,508 | B1 * | 4/2013 | Yen et al. | 257/98 |
| 2010/0203661 | A1 * | 8/2010 | Hodota | 438/29 |
| 2013/0015461 | A1 * | 1/2013 | Lin | 257/76 |

FOREIGN PATENT DOCUMENTS

JP 2004-158872 3/2013

* cited by examiner

*Primary Examiner* — Tan N Tran
(74) *Attorney, Agent, or Firm* — Dentons US LLP

(57) ABSTRACT

A light emitting device includes: a laminated body including a first-conductivity type semiconductor layer, a light emitting layer, and a second-conductivity type semiconductor layer in this order; a contact layer provided in contact with the second-conductivity type semiconductor layer at least at a peripheral edge of the second-conductivity type semiconductor layer; a first electrode electrically connected to the first-conductivity type semiconductor layer; a second electrode provided nearer to the first-conductivity type semiconductor layer than the second-conductivity type semiconductor layer; and a conductor electrically connecting the second electrode and the contact layer to each other.

14 Claims, 14 Drawing Sheets

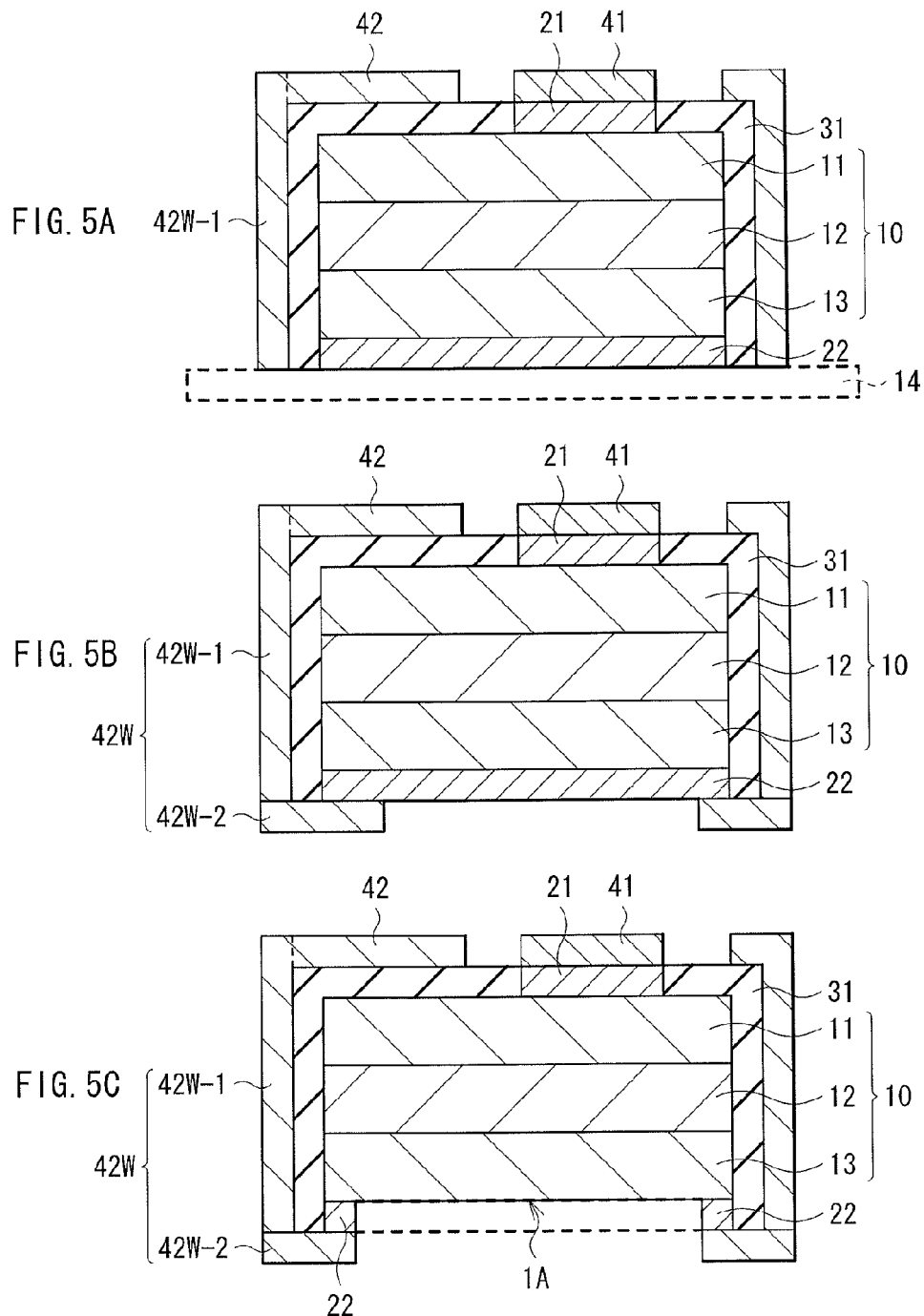

LIGHT EMITTING DEVICE AND METHOD OF MANUFACTURING THE SAME, AND LIGHT EMITTING UNIT

BACKGROUND

The present technology relates to a light emitting device suitable for, for example, a surface-emitting type LED (Light Emitting Diode), to a method of manufacturing the light emitting device, and to a light emitting unit.

In recent years, a light emitting device such as an LED is used in a backlight of a liquid crystal display apparatus, a lighting apparatus, a display, and the like. Such a light emitting device has a lamination structure including an n-type cladding layer, a light emitting layer, and a p-type cladding layer, and extracts light by applying a voltage between electrodes respectively disposed on an n-type cladding layer side (lower side, for example) and a p-type cladding layer side (upper side, for example). With this voltage application, in a so-called surface-emitting type light emitting device, light is extracted from the n-type cladding layer side or the p-type cladding layer side.

Incidentally, flip chip mounting of such a light emitting device is desired in order to facilitate, simplify, and highly densify the mounting. In order to perform the flip chip mounting, it is necessary to collectively dispose a pair of electrodes on one of upper and lower sides. For example, in Japanese Unexamined Patent Application Publication No. 2004-158872, a step is provided to semiconductor layers to expose a part of the layers, and an electrode is disposed at the exposed portion of the semiconductor layers. Thus, a pair of electrodes are collectively disposed on the same side (lower side, for example).

SUMMARY

However, when an exposed portion is provided to a semiconductor layer in this way, a light emitting device may easily break. In addition, since the exposed portion serves as a non-light-emitting region, there has been a risk that the ratio of an effective light emission area to a mounting area is decreased, thus lowering light emission efficiency.

It is desirable to provide a light emitting device that achieves flip chip mounting and provides greater strength and light emission efficiency, a method of manufacturing the light emitting device, and a light emitting unit.

A light emitting device according to an embodiment of the present technology includes: a laminated body including a first-conductivity type semiconductor layer, a light emitting layer, and a second-conductivity type semiconductor layer in this order; a contact layer provided in contact with the second-conductivity type semiconductor layer at least at a peripheral edge of the second-conductivity type semiconductor layer; a first electrode electrically connected to the first-conductivity type semiconductor layer; a second electrode provided nearer to the first-conductivity type semiconductor layer than the second-conductivity type semiconductor layer; and a conductor electrically connecting the second electrode and the contact layer to each other.

A light emitting unit according to an embodiment of the present technology is provided with a light emitting device. The light emitting device includes: a laminated body including a first-conductivity type semiconductor layer, a light emitting layer, and a second-conductivity type semiconductor layer in this order; a contact layer provided in contact with the second-conductivity type semiconductor layer at least at a peripheral edge of the second-conductivity type semiconductor layer; a first electrode electrically connected to the first-conductivity type semiconductor layer; a second electrode provided nearer to the first-conductivity type semiconductor layer than the second-conductivity type semiconductor layer; and a conductor electrically connecting the second electrode and the contact layer to each other.

In the light emitting device and the light emitting unit according to the above-described respective embodiments of the present technology, the second electrode on the first-conductivity type semiconductor layer side and the contact layer on the second-conductivity type semiconductor layer side are electrically connected to each other by the conductor. In other words, it is possible to dispose the second electrode on the first-conductivity type semiconductor layer side without forming an exposed portion to a semiconductor layer (such as the first-conductivity type semiconductor layer, the light emitting layer, the second-conductivity type semiconductor layer, and the contact layer).

A method of manufacturing a light emitting device according to an embodiment of the present technology includes: forming a laminated body and a contact layer, the laminated body including a first-conductivity type semiconductor layer, a light emitting layer, and a second-conductivity type semiconductor layer in this order, and the contact layer being formed at least at a peripheral edge of the second-conductivity type semiconductor layer; forming a first electrode in a region nearer to the first-conductivity type semiconductor layer than the second-conductivity type semiconductor layer; and forming a second electrode and electrically connecting the second electrode and the contact layer to each other through a conductor, the second electrode being formed in the region nearer to the first-conductivity type semiconductor layer than the second-conductivity type semiconductor layer.

According to the light emitting device, the method of manufacturing the light emitting device, and the light emitting unit of the above-described respective embodiments of the present technology, the second electrode is provided on the first-conductivity type semiconductor layer side, and the second electrode and the contact layer on the second-conductivity type semiconductor layer side are connected to each other by the conductor. This makes it possible to dispose both the first electrode and the second electrode on the first-conductivity type semiconductor layer side without providing an exposed portion to a semiconductor layer. Hence, it is possible to prevent breakage and decrease in effective light emission area from occurring, and thus to achieve greater strength and greater light emission efficiency.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 5A to 5C are sectional views showing processes subsequent to the process illustrated in FIG. 4C.

FIG. 8 is applied.

DETAILED DESCRIPTION

Figure 1:
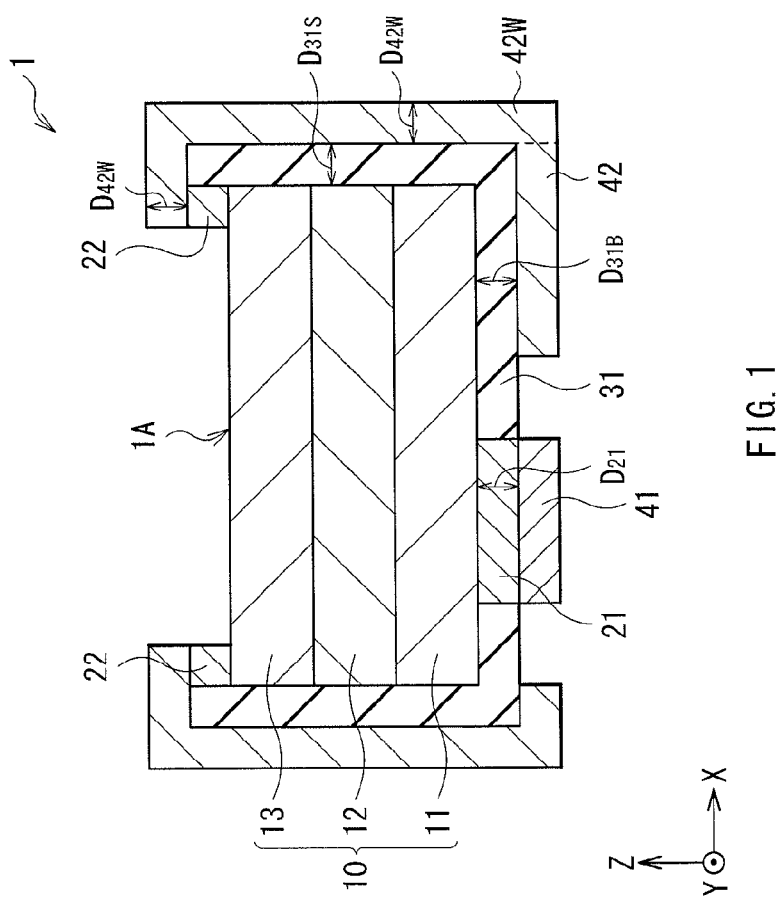
FIG. 1 is a view showing a configuration of a light emitting device according to an embodiment of the present disclosure.

Referring to the drawings, an embodiment of the present technology will be described in detail below. It is to be noted that description will be made in the following order.
1. Embodiment
An exemplary case where a contact layer is provided in contact with only a peripheral edge of a second-conductivity type semiconductor layer
2. Modification
An exemplary case where a contact layer includes an eaves portion provided at an outer part of a second-conductivity type semiconductor layer Embodiment FIG. 1 shows a cross-sectional configuration of a light emitting device (light emitting device 1) according to an embodiment of the present disclosure. The light emitting device 1 is a surface-emitting type light emitting device which includes a quadrangular-prism shaped laminated body 10 and a light extraction face 1A formed on a top surface of the laminated body 10, for example. Side surfaces of the laminated body 10 may be covered with a p-side wiring line 42W (wiring line or "conductor") with an insulating film 31 therebetween. An n-side electrode 41 (first electrode) and a p-side electrode 42 (second electrode) may be disposed on a bottom surface side of the laminated body 10.

The laminated body 10 may be an LED (light-emitting diode), and includes an n-type cladding layer 11 (first-conductivity type semiconductor layer), a light emitting layer 12, a p-type cladding layer 13 (second-conductivity type semiconductor layer) in this order. In the light emitting device 1, light having a wavelength corresponding to the band gap thereof is generated at the light emitting layer 12, and the light may be extracted from a top surface (a face on a side opposite to the light emitting layer 12 side) of the p-type cladding layer 13 (the light extraction face 1A). The n-type cladding layer 11 may be formed of n-type $(Al_{0.7}Ga_{0.3})_{0.5}In_{0.5}P$ having a thickness of about 1000 nm to about 2000 nm both inclusive (in a Z-axis direction) and a carrier density of about $1×10^{18}$ cm$^3$, for example. The light emitting layer 12 may have a quantum well structure in which a well layer of InGaP having a thickness of about 3 nm to about 10 nm both inclusive and a barrier layer of $(Al_{0.6}Ga_{0.4})_{0.5}In_{0.5}P$ having a thickness of about 10 nm to about 100 nm both inclusive are alternately laminated (for example, 10QW). The p-type cladding layer 13 may be formed of p-type $(Al_{0.7}Ga_{0.3})_{0.5}In_{0.5}P$ having a thickness of about 300 nm to about 1000 nm both inclusive and a carrier density of about $1×10^{17}$ to about $1×10^{18}$ cm$^3$ both inclusive, for example. The laminated body 10 may have a square shape with each side measuring about 10 μm to about 5 mm both inclusive in plan view, for example. In addition to the above-mentioned structure, the laminated body 10 may include other common or unique structures for improving light emission efficiency.

The n-side electrode 41 is provided on a part of a bottom surface (a face on a side opposite to the light emitting layer 12 side) side of the n-type cladding layer 11, and an n-side contact layer 21 is interposed between the n-side electrode 41 and the n-type cladding layer 11. The n-side electrode 41 is electrically connected to the n-type cladding layer 11 through the n-side contact layer 21, and is configured to inject a current into a semiconductor layer (such as the n-type cladding layer 11, the light emitting layer 12, and the p-type cladding layer 13) in conjunction with the p-side electrode 42. The n-side electrode 41 may have a structure in which an alloy of gold (Au) and germanium (Ge) (i.e., AuGe), nickel (Ni), and gold are laminated in this order from the n-type cladding layer 11 side (i.e., AuGe/Ni/Au), for example. The n-side contact layer 21 may be formed of n-type GaAs having a thickness $D_{21}$ of about 100 nm to about 1 μm both inclusive, for example. This thickness $D_{21}$ may be equal to or different from a thickness $D_{31B}$ (described later) of the insulating film 31.

Together with the n-side electrode 41, the p-side electrode 42 is provided at a part of the bottom surface side (right end portion in FIG. 1) of the n-type cladding layer 11, and the insulating film 31 is interposed between the n-type cladding layer 11 and the p-side electrode 42. Disposing the p-side electrode 42 and the n-side electrode 41 on the same side (lower side) in this manner makes it possible to achieve flip chip mounting of the light emitting device 1. In the present embodiment, the p-side electrode 42 is electrically connected to the p-type cladding layer 13 through the p-side wiring line 42W. Although details are described later, this makes it possible to dispose the p-side electrode 42 and the n-side electrode 41 on the same side (i.e., the p-side electrode 42 is provided in a region nearer to the n-type cladding layer 11 than the p-type cladding layer 13) without providing a semiconductor layer with an exposed portion, and thus realizes simple and easy mounting such as flip chip mounting. The p-side electrode 42 may have a lamination structure in which titanium (Ti), platinum (Pt), and gold are laminated from the n-type cladding layer 11 side (Ti/Pt/Au), for example.

The p-side wiring line 42W and the p-type cladding layer 13 are electrically connected to each other through a p-side contact layer 22 (contact layer). This p-side contact layer 22 may be formed of p-type GaAs, p-type GaP, or p-type AlGaAs having a thickness of about 100 nm to about 1 μm both inclusive (in the Z-axis direction), and may be in contact with a peripheral edge (periphery) portion of the top surface of the p-type cladding layer 13, for example. The width of the p-side contact layer 22 (in an X-axis direction) may be, for example, about 100 nm to about 10 μm both inclusive. In this case, since the p-side contact layer 22 is provided only at the peripheral edge of the p-type cladding layer 13, a center portion of the top surface of the p-type cladding layer 13 which serves as the light extraction face 1A is broadly exposed. In addition, the p-side contact layer 22 is not provided at an outer part of the p-type cladding layer 13 (the laminated body 10) as well. In other words, by minimizing the size of the area in which the p-side contact layer 22 is provided, it is possible to prevent the p-side contact layer 22 from absorbing light, and thus to enhance light extraction efficiency. In the case where the p-side contact layer 22 is made of a transparent material, the p-side contact layer 22 may be provided on the entire top surface of the p-type cladding layer 13.

The p-side wiring line 42W electrically connects the p-side contact layer 22 and the p-side electrode 42 to each other. The p-side wiring line 42W may be integrally formed with the p-side electrode 42 provided on the bottom surface side of the n-type cladding layer 11. The p-side wiring line 42W extends along the side surface of the laminated body 10, and further, covers the top surface of the p-side contact layer 22 so as to be in contact with the p-side contact layer 22. In other words, the p-side wiring line 42W may be provided from the side surface of the laminated body 10 to the peripheral edge of the top surface of the laminated body 10. Since the p-side wiring line 42W covers the top surface of the p-side contact layer 22 in this instance, it is possible to lower the drive voltage of the light emitting device 1 by changing the width of the p-side contact layer 22 to adjust the contact area between the p-side wiring line 42W and the p-side contact layer 22. The p-side wiring line 42W may be made of, for example, a material similar to that of the p-side electrode 42. As long as the electric connection with the p-side electrode 42 is ensured, the p-side wiring line 42W may be made of other materials different from the material of the p-side electrode 42.

The insulating film 31 may be provided to ensure the insulation property between the p-side wiring line 42W and the n-type cladding layer 11, and may be provided between the p-side wiring line 42W and the laminated body 10. The insulating film 31 may be made of a transparent insulating material such as $SiO_2$, SiN, and $Al_2O_3$.

The p-side wiring line 42W extends in a vertical direction of the laminated body 10 as described above to connect the p-side electrode 42 and the p-side contact layer 22 to each other. That is, in the light emitting device 1, it is only necessary that the insulating film 31 and the p-side wiring line 42W are provided on at least a part of the side surface of the laminated body 10. When the p-side wiring line 42W is disposed on a part of the side surface of the laminated body 10, a greater degree of freedom of structural layout is obtained. In addition, as the area of the p-side wiring line 42W is decreased, static electricity fracture through the insulating film 31 becomes less likely to occur, and thus the probability of static electricity fracture is suppressed. On the other hand, when the p-side wiring line 42W and the insulating film 31 cover the entire side surface of the laminated body 10, the following effect is obtained.

Figure 2A:
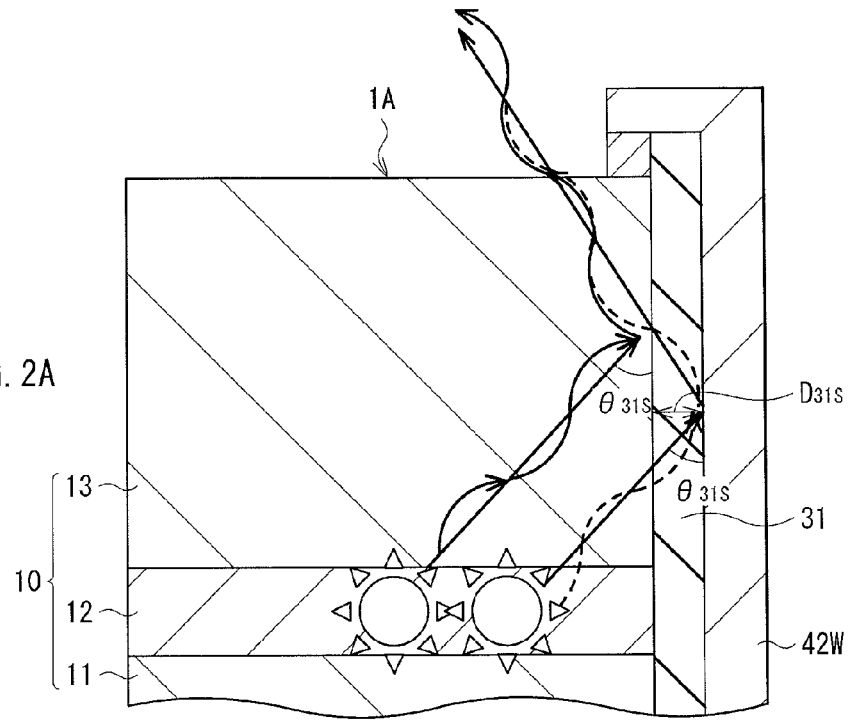
FIGS. 2A and 2B are views for describing reflection of light generated at the light emitting layer illustrated in FIG. 1.
Figure 2B:
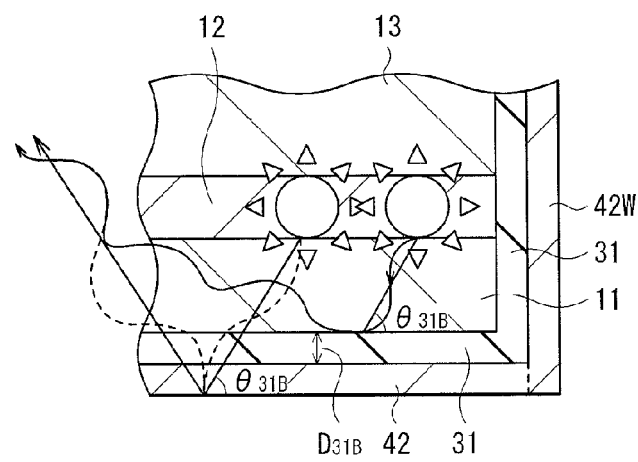

As illustrated in FIG. 2A and FIG. 2B, light generated at the light emitting layer 12 is reflected by a boundary surface between the laminated body 10 and the insulating film 31 (the laminated body 10/the insulating film 31) and a boundary surface between the insulating film 31 and the p-side wiring line 42W or the p-side electrode 42 (the insulating film 31/the p-side wiring line 42W or the insulating film 31/the p-side electrode 42). The light beams reflected by the respective two boundary surfaces reinforce each other by the interference effect when the following expression (1) is satisfied. Specifically, when the insulating film 31 covers the entire side surface of the laminated body 10, and the thickness $D_{31}$ thereof satisfies the expression (1), the light emission efficiency of the light emitting device 1 further increases. It is to be noted that, in the expression (1), λ is a wavelength of light generated at the light emitting layer 12, $θ_{31}$ is an incident angle, relative to the insulating film 31, of light generated at the light emitting layer 12, $D_{31}$ is a thickness of the insulating film 31, $n_{31}$ is a refractive index of the insulating film 31, and m is an integer of 0 or more.

$$2D_{31} \times \cos θ_{31} = (m+1/2) \times λ/n_{31} \quad (1)$$

In addition, a configuration may be employed in which $D_{31B}$ and $D_{31S}$ respectively satisfy the following expressions (2) and (3), where, of the thickness $D_{31}$ of the insulating film 31, $D_{31B}$ is a thickness of the insulating film 31 between the laminated body 10 and the p-side electrode 42, and $D_{31S}$ is a thickness of the insulating film 31 between the laminated body 10 and the p-side wiring line 42W. The thickness $D_{31B}$ and the thickness $D_{31S}$ may be either equal to each other or different from each other. It is to be noted that, in the expression (2), $θ_{31B}$ is an incident angle, relative to the insulating film 31 and the p-side electrode 42, of light generated at light emitting layer 12, and m1 is an integer of 0 or more; in the expression (3), $θ_{31S}$ is an incident angle, relative to the insulating film 31 and the p-side wiring line 42W, of light generated at light emitting layer 12, and m2 is an integer of 0 or more.

$$2D_{31B} \times \cos θ_{31B} = (m1+1/2) \times λ/n_{31} \quad (2)$$

$$2D_{31S} \times \cos θ_{31S} = (m2+1/2) \times λ/n_{31} \quad (3)$$

The light emitting device 1 may be manufactured in the following manner, for example.

Figure 3A:
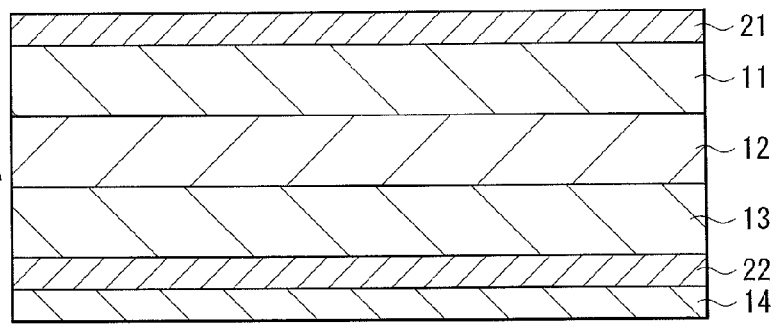
FIGS. 3A to 3C are sectional views showing a method of manufacturing the light emitting device illustrated in FIG. 1 in the order of processes.
Figure 3B:
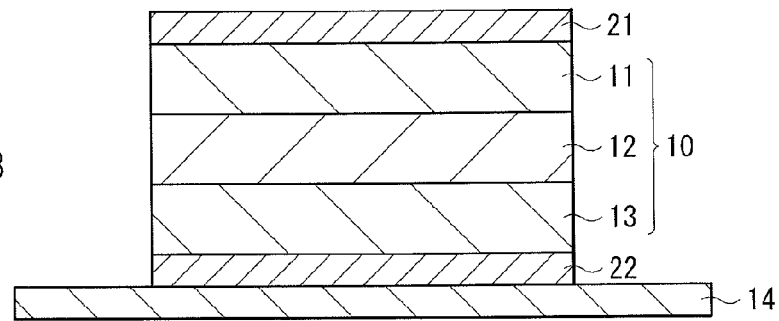

First, for example, on a substrate 14 which may be made of GaAs, the p-side contact layer 22 which may be made of p-type GaAs, p-type GaP, or p-type AlGaAs, the p-type cladding layer 13 which may be made of p-type $(Al_{0.7}Ga_{0.3})_{0.5}In_{0.5}P$, the light emitting layer 12 which may have a lamination structure of InGaP and $(Al_{0.6}Ga_{0.4})_{0.5}In_{0.5}P$, the n-type cladding layer 11 which may be made of n-type $(Al_{0.7}Ga_{0.3})_{0.5}In_{0.5}P$, and the n-side contact layer 21 which may be made of n-type GaAs are formed in this order by a method such as the MOCVD (metal organic chemical vapor deposition) method and the MBE (molecular beam epitaxy) method (FIG. 3A). The "In" composition of InGaP of the light emitting layer 12 is previously adjusted such that emitted light has a desired wavelength. Next, a method such as dry etching and wet etching is performed on the layers ranging from the n-side contact layer 21 to the p-side contact layer 22 to obtain a desired form (FIG. 3B). In this way, the laminated body 10 is formed.

Figure 3C:
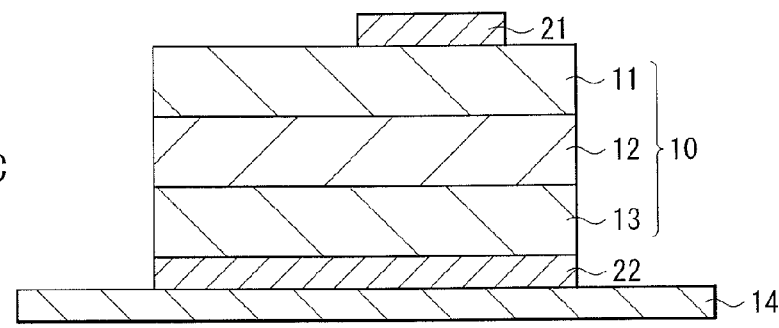
Figure 4A:
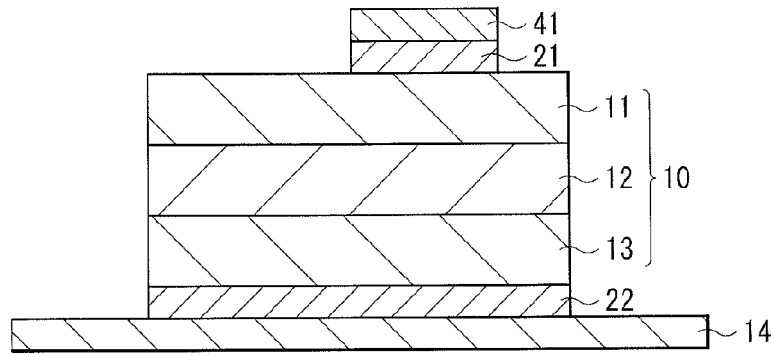
FIGS. 4A to 4C are sectional views showing processes subsequent to the process illustrated in FIG. 3C.

Next, as illustrated in FIG. 3C, only the n-side contact layer 21 is etched. Thus, the n-side contact layer 21 is formed on a part of the top surface (the bottom surface in FIG. 1) of the laminated body 10. The etching may be either dry etching or wet etching. Next, as illustrated in FIG. 4A, the n-side electrode 41 is formed on the n-side contact layer 21. The n-side electrode 41 is so formed as to have the same planar shape as the n-side contact layer 21 and to be in contact with the n-side contact layer 21. The order of processes illustrated in FIG. 3C and FIG. 4A may be reversed, in other words, it is possible to etch the n-side contact layer 21 after the n-side electrode 41 is formed.

Figure 4B:
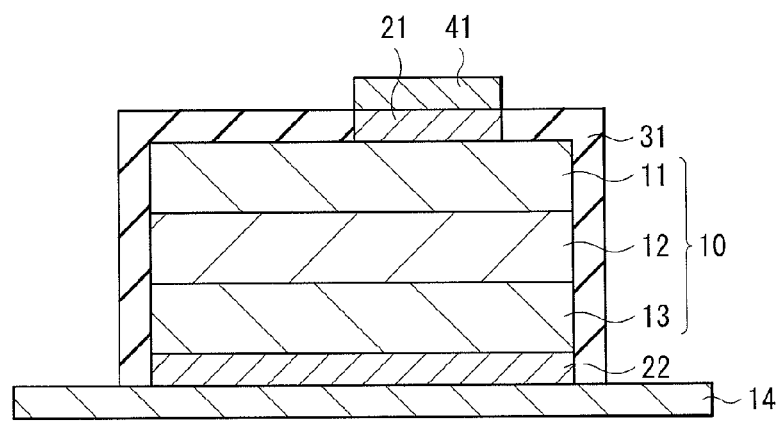

Next, the insulating film 31 may be so formed as to cover the top surface and the side surface of the laminated body 10 and the side surface of the p-side contact layer 22 (FIG. 4B). At this time, an opening through which the n-side electrode 41 is exposed may be provided to the insulating film 31.

Figure 4C:
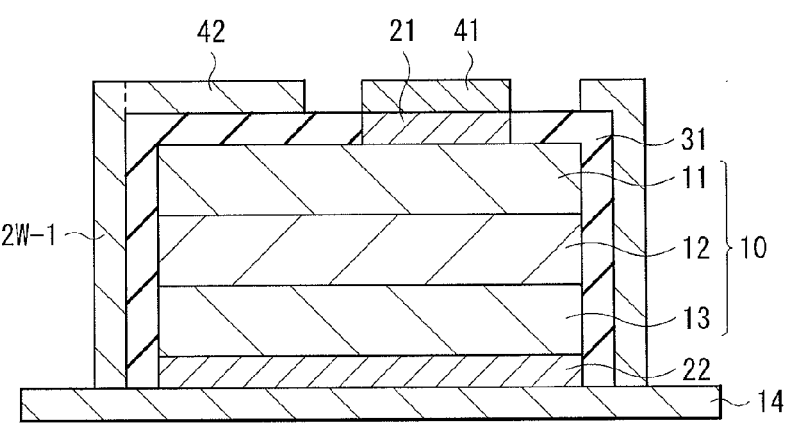

Next, as illustrated in FIG. 4C, with the insulating film 31 therebetween, a p-side wiring line (conductor) 42W-1 is provided on the side surface of the laminated body 10, and the p-side electrode 42 is provided on the top surface (the bottom surface in FIG. 1) of the n-type cladding layer 11. The p-side wiring line 42W-1 configures the p-side wiring line 42W together with a p-side wiring line (conductor) 42W-2 described later. The p-side wiring line 42W-1 and the p-side electrode 42 may be continuously formed with use of the same material, for example. The p-side wiring line 42W-1 and the p-side electrode 42 may be made of materials different from each other as long as the electrical conduction therebetween is ensured.

Next, after the substrate 14 is removed (FIG. 5A), the p-side wiring line 42W-2 is formed as illustrated in FIG. 5B. This p-side wiring line 42W-2 is so formed as to be connected to the p-side wiring line 42W-1 and to cover the peripheral edge of the bottom surface (the top surface in FIG. 1) of the p-side contact layer 22. Thus, the p-side wiring line 42W is formed. Next, except for the portion covered with the p-side wiring line 42W-2, the p-side contact layer 22 is removed by a method such as dry etching and wet etching as illustrated in FIG. 5C. Thus, the light extraction face 1A is formed on the p-type cladding layer 13. In the case where the p-side contact layer 22 is made of a material such as GaP and AlGaAs and thereby transmits light having a wavelength generated at the light emitting layer 12, the process of etching the p-side contact layer 22 may be omitted. It is also possible to form the p-side wiring line 42W-2 after the p-side contact layer 22 is etched. Through the above-mentioned processes, the light emitting device 1 illustrated in FIG. 1 is completed. As described, the light emitting device 1 is manufactured without making significant change in the existing manufacturing facilities and configuration materials, and the light emitting device 1 achieves flip chip mounting, which is advantageous in terms of facilitation, simplification, and densification of mounting.

Figure 6:
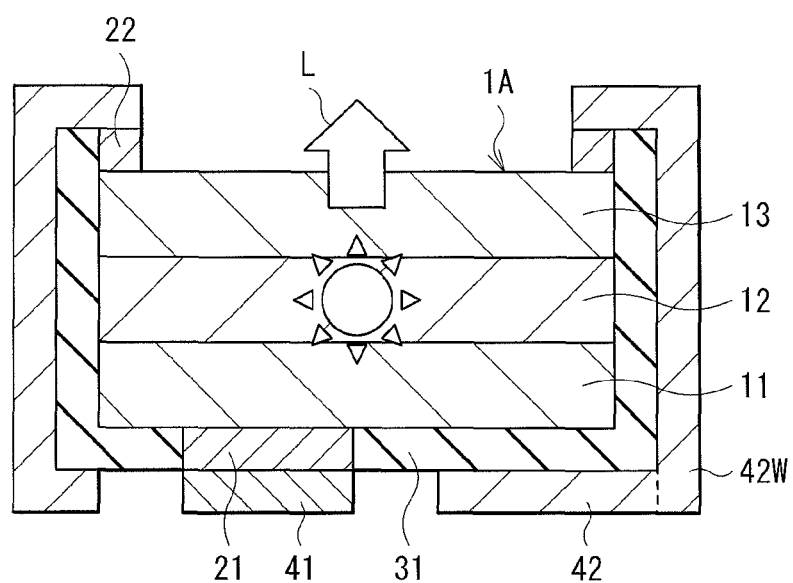
FIG. 6 is a view for describing light extraction of the light emitting device illustrated in FIG. 1.

In the light emitting device 1, when a predetermined voltage is applied between the n-side electrode 41 and the p-side electrode 42, electrons from the n-type cladding layer 11 side and holes from the p-type cladding layer 13 side are injected into the light emitting layer 12. Photon (light L) is generated by the recombination of the electrons and holes injected into the light emitting layer 12, and the generated light is extracted from the light extraction face 1A (FIG. 6). Since the p-side wiring line 42W is provided in this instance, it is possible to dispose the p-side electrode 42 on the n-type cladding layer 11 side without forming an exposed portion to a semiconductor layer. This point will be described in detail below.

Figure 7A:
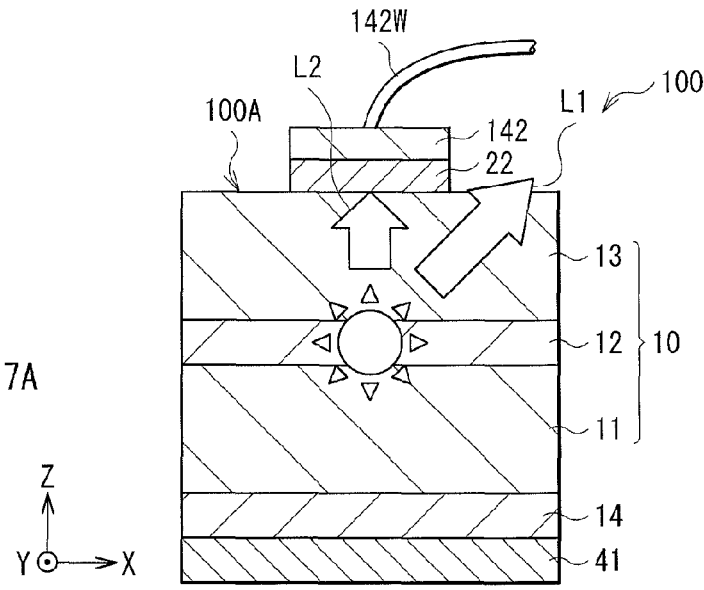
FIGS. 7A and 7B are views each showing a configuration of a light emitting device according to a comparative example.

FIG. 7A shows a cross-sectional configuration of a light emitting device 100 according to a comparative example 1. In this light emitting device 100, an n-side electrode 41 is disposed on the n-type cladding layer 11 side (lower side), and a p-side electrode 142 is disposed on the p-type cladding layer 13 side (upper side). In other words, the n-side electrode 41 and the p-side electrode 142 are provided on the opposite sides in a vertical direction, and therefore, it is difficult to perform flip chip mounting. In addition, the p-side electrode 142 of the light emitting device 100 is provided on the light extraction face 100A of the p-type cladding layer 13, and thus when light is extracted from the light emitting device 100 (light L1), part of the light generated at the light emitting layer 12 (light L2) is absorbed by the p-side electrode 142 and a wiring line 142W connected to the p-side electrode 142. In other words, the p-side electrode 142 and the wiring line 142W reduce the efficiency of light extraction.

Figure 7B:
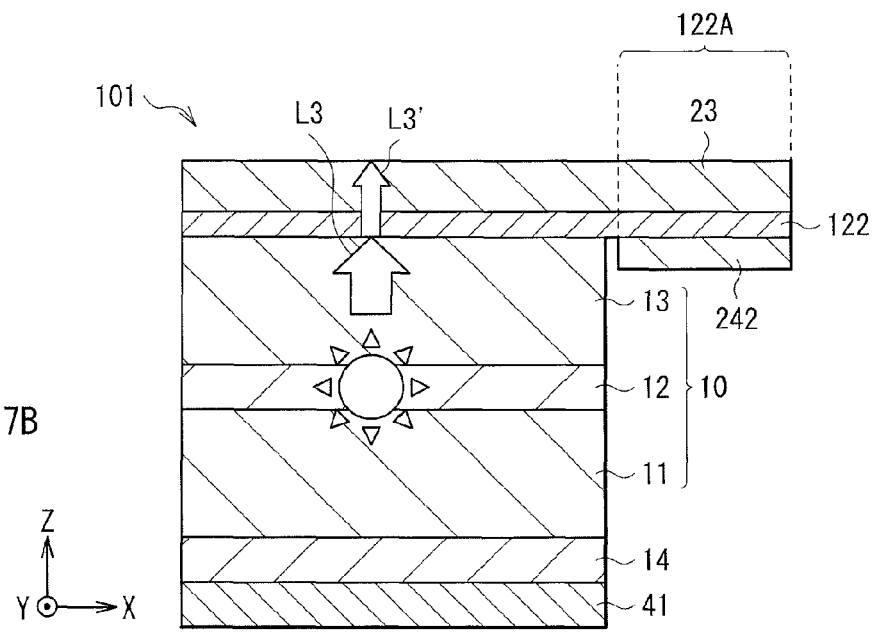

On the other hand, in a light emitting device 101 according to a comparative example 2 (FIG. 7B), a p-side electrode 242 is provided to an exposed portion 122A of a p-side contact layer 122, and thus both the n-side electrode 41 and the p-side electrode 242 are disposed on the lower side. The exposed portion 122A is configured such that a part of the p-side contact layer 122 supported by a holding substrate 23 is laterally extended relative to the laminated body 10. The light emitting device 101 realizes flip chip mounting; however, since a step is formed between the laminated body 10 and the p-side contact layer 122, mechanical strength is decreased at this portion, and thus breakage may occur easily. In particular, in the case where the light emitting layer 12 is configured of a light emitting device of red to yellow-green (having an emission wavelength of about 550 nm to about 750 nm both inclusive, for example) containing one or more elements of Al, In, Ga, P, and As, the p-side contact layer 122 is fragile, and the breakage occurs easily (see, for example, "Impurity effects on the mechanical behavior of GaAs crystals.", J. Appl. Phys., 71, 4249 (1992)). In addition, since the exposed portion 122A serves as a non-light-emitting region, the ratio of the effective light emission area to the mounting area of the light emitting device 101 is decreased.

Further, when it is difficult to use materials which are transparent to light (light L3) generated at the light emitting layer 12 for the p-side contact layer 122 and the holding substrate 23, the light L3 generated at the light emitting layer 12 is absorbed by the p-side contact layer 122 and the holding substrate 23, and the amount of light to be extracted (light L3') is decreased. For example, in the case of the above-mentioned light emitting device of red to yellow-green, it is difficult to form the p-side contact layer 122 and the holding substrate 23 by transparent materials (see, for example, "On an AlGaInP-Based Light-Emitting Diode with an ITO Direct Ohmic Contact Structure.", IEEE Electron device letters, vol. 30-4, April 2009, and "Increasing the Extraction Efficiency of AlGaInP LEDs via n-Side Surface Roughening.", IEEE photonics technology letters, vol. 17-11, November 2005).

In contrast, since in the light emitting device 1 the p-side electrode 42 is electrically connected to the p-side contact layer 22 through the p-side wiring line 42W, it is possible to dispose the p-side electrode 42 on the n-type cladding layer 11 side (lower side in FIG. 1, i.e., the p-side electrode 42 is provided nearer to the n-type cladding layer 11 than the p-type cladding layer 13) without providing an exposed portion to a semiconductor layer. Consequently, it is possible to perform flip chip mounting while maintaining the strength. In addition, the ratio of the effective light emission area is prevented from decreasing. Further, the p-side electrode 42 is not present on the light extraction face 1A, and therefore there is no risk that the p-side electrode 42 decreases the light extraction efficiency. Additionally, since the p-side contact layer 22 is provided only at the peripheral edge of the p-type cladding layer, it is possible to suppress the reduction in the amount of light due to light absorption of the p-side contact layer 22 even in the case where the p-side contact layer 22 is not made of transparent materials.

As described, since the p-side wiring line 42W is provided in the present embodiment, it is possible to dispose the p-side electrode 42 on the n-type cladding layer 11 side without forming an exposed portion to a semiconductor layer. As a result, it is possible to improve the strength and the light emission efficiency.

Also, when the insulating film 31 and the p-side wiring line 42W are provided on the entire side surface of the laminated body 10 while satisfying the expression (1), it is possible to further improve the light emission efficiency.

While a modification of the present technology will be described below, the same components as those of the above-mentioned embodiment will be given the same reference numerals, and their descriptions will not be described in detail for simplicity.

[Modification]

Figure 8:
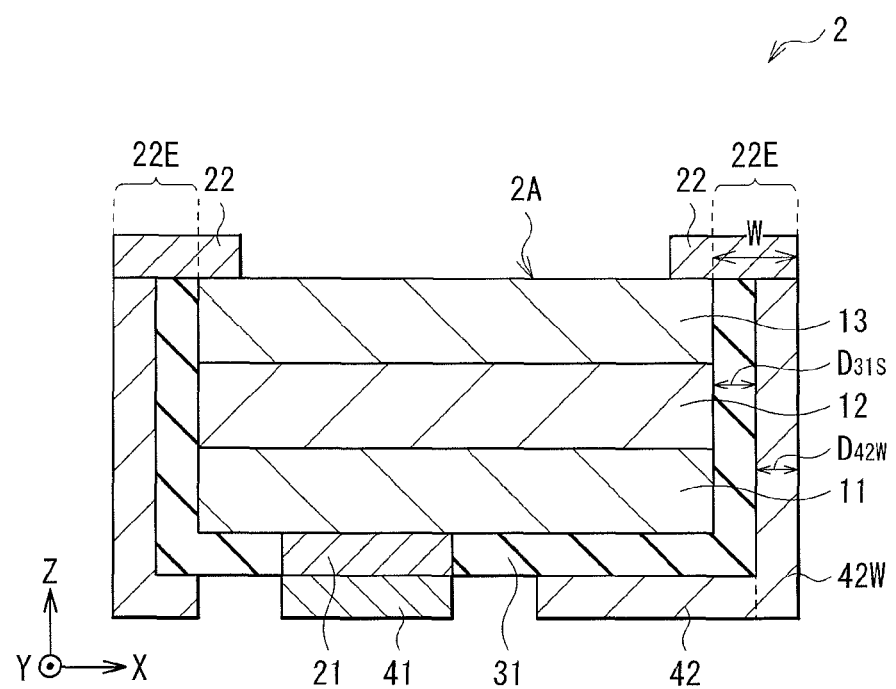
FIG. 8 is a sectional view showing a configuration of a light emitting device according to a modification.

FIG. 8 shows a cross-sectional configuration of a light emitting device 2 according to a modification of the above-mentioned embodiment. This light emitting device 2 is different from the light emitting device 1 of the above-mentioned embodiment in that the p-side contact layer 22 includes an eaves portion 22E. Except for that point, the light emitting device 2 is the same as the light emitting device 1 of the above-mentioned embodiment in configuration, functions, and effects.

The eaves portion 22E is a portion of the p-side contact layer 22 protruding outwardly of the laminated body 10 (the p-type cladding layer 13). In the light emitting device 2, the eaves portion 22E may be supported by the insulating film 31 and the p-side wiring line 42W. A width W (in the X-axis direction) of the eaves portion 22E may be substantially equal to the sum of the thickness $D_{31S}$ of the insulating film 31 and a thickness $D_{42W}$ of the p-side wiring line 42W (W=$D_{31S}$+$D_{42W}$). The width W differs depending on the size of the laminated body 10, and may be about 100 nm to about 10 μm both inclusive, for example. Here, the term "substantially equal" refers to inclusion of manufacturing error, and the sum of the thickness $D_{31S}$ of the insulating film 31 and the thickness $D_{42W}$ of the p-side wiring line 42W may be deviated in some degree from the width W of the eaves portion 22E as long as the eaves portion 22E is supported by the insulating film 31 and the p-side wiring line 42W.

In the light emitting device 2, since a contact surface S between the p-side wiring line 42W and the p-side contact layer 22 is decreased in size (for example, S=$D_{42W} \times L_{42W}$, where $L_{42W}$ is an outer periphery length of the p-side wiring line 42W (the laminated body 10)), there is a risk that the drive voltage may be increased. However, the increase in drive voltage does not cause a major problem for one reason discussed below.

For example, a common light emitting device having a size of about 300 μm square is provided with a p-side electrode having a diameter of about 80 μm (φ=80 μm). In this case, a voltage drop calculated based on a planar dimension A (A=$40^2 \times \pi$) of the electrode is about 0.008 V. Meanwhile, in the light emitting device 2, if the thickness $D_{42W}$ of the p-side wiring line 42W is 3 μm and the outer periphery length $L_{42W}$ is (300×4) μm, then S=3×(300×4) is established, and hence the voltage drop is about 0.01 V. It can be said that this voltage drop of the light emitting device 2 is sufficiently small in value since, in general, the drive voltage of a light emitting device is about 2 V.

For example, the light emitting device 2 may be manufactured as follows.

Figure 9A:
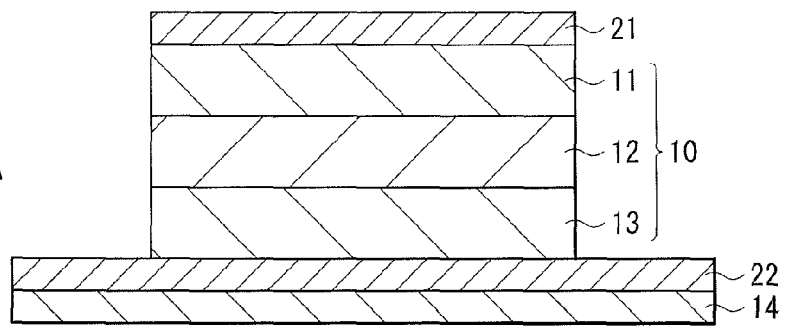
FIGS. 9A to 9C are sectional views showing a method of manufacturing the light emitting device illustrated in FIG. 8 in the order of processes.
Figure 9B:
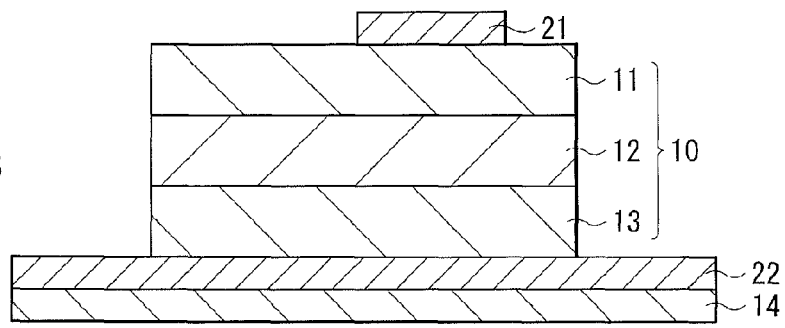
Figure 9C:
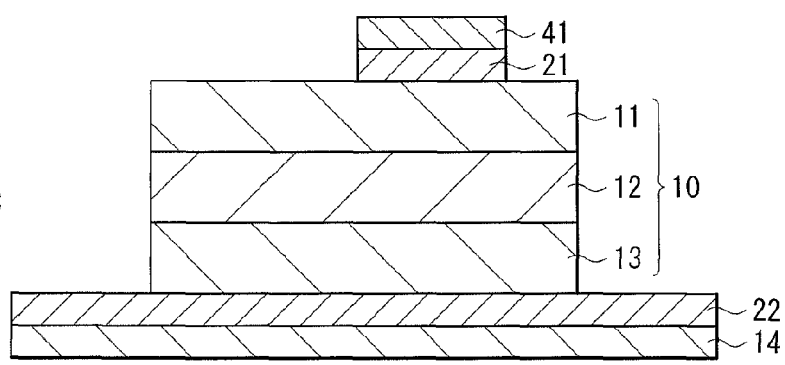

First, as with the case of the light emitting device 1, the p-side contact layer 22, the p-type cladding layer 13, the light emitting layer 12, the n-type cladding layer 11, and the n-side contact layer 21 are formed on the substrate 14 in this order (FIG. 3A). Next, as illustrated in FIG. 9A, the layers ranging from the n-side contact layer 21 to the p-type cladding layer 13 are etched to obtain a desired form. At this time, the p-side contact layer 22 is not etched. Next, after only the n-side contact layer 21 is etched (FIG. 9B), the n-side electrode 41 is formed on the n-side contact layer 21 as illustrated in FIG. 9C. In this manner, the n-side contact layer 21 and the n-side electrode 41 are formed on a part of the top surface of the laminated body 10 (bottom surface in FIG. 8).

Figure 10A:
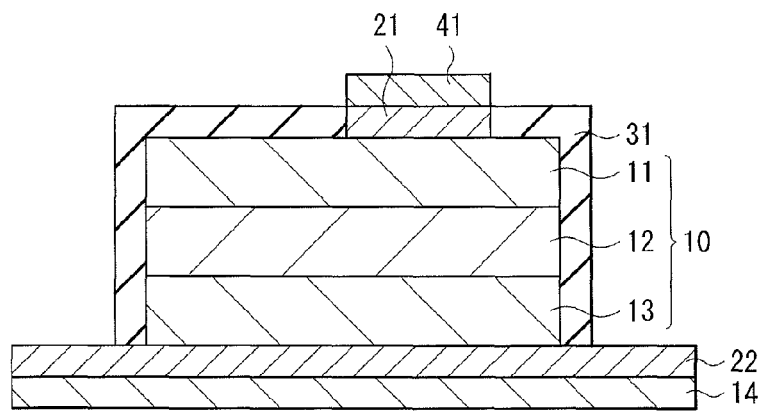
FIGS. 10A and 10B are sectional views showing processes subsequent to the process illustrated in FIG. 9C.

Next, as illustrated in FIG. 10A, the insulating film 31 may be so formed as to cover the top surface and side surface of the laminated body 10. At this time, an opening may be provided to the insulating film 31 so that the n-side electrode 41 is exposed.

Figure 10B:
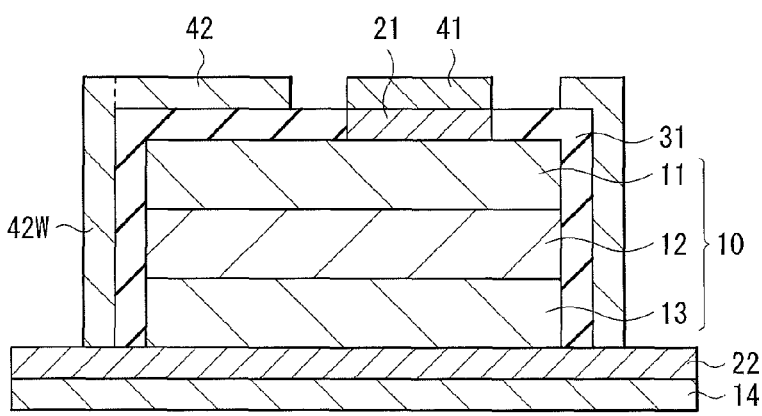
Figure 11A:
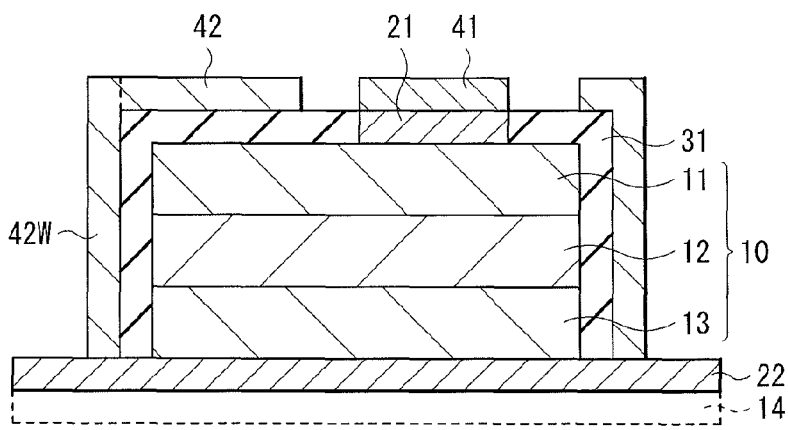
FIGS. 11A and 11B are sectional views showing processes subsequent to the process illustrated in FIG. 10B.
Figure 11B:
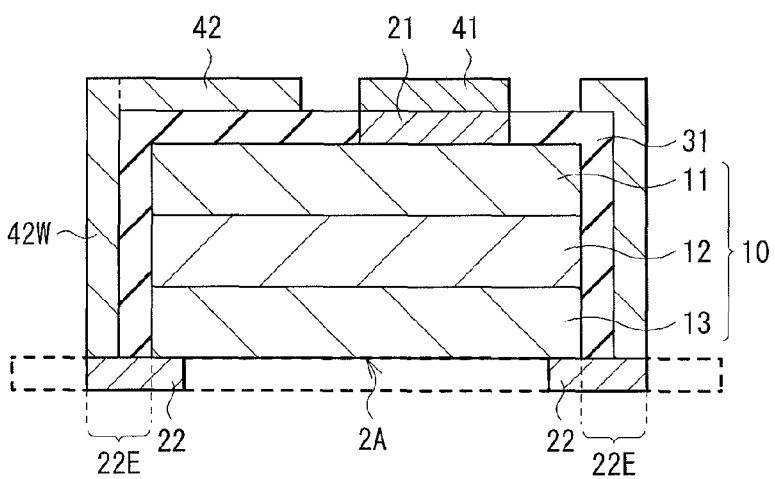

Next, as illustrated in FIG. 10B, the p-side wiring line 42W and the p-side electrode 42 are formed on the side surface of the laminated body 10 and on the top surface (bottom surface in FIG. 8) of the n-type cladding layer 11, respectively, with the insulating film 31 therebetween, and thereafter the substrate 14 is removed (FIG. 11A). Next, as illustrated in FIG. 11B, the p-side contact layer 22 may be patterned by, for example, photolithography and etching. At this time, patterning is so performed as to provide the eaves portion 22E to the p-side contact layer 22. Through the above-mentioned processes, the light emitting device 2 illustrated in FIG. 8 is completed. Since the process of forming the p-side wiring line 42W-2 (FIG. 5B) is unnecessary in the case of the light emitting device 2, it is possible to reduce the number of processes.

[Light Emitting Unit]

Figure 12A:
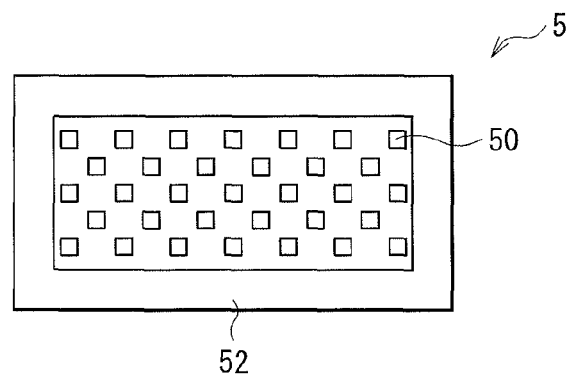
FIGS. 12A and 12B are views each showing a configuration of a light emitting unit to which one of the light emitting devices illustrated in FIG. 1
Figure 12B:
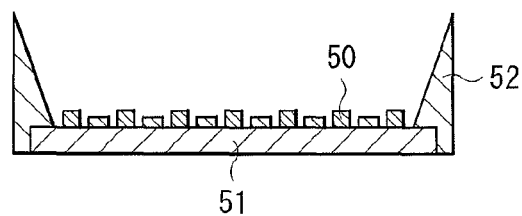

The light emitting devices 1 and 2 described in the above-mentioned embodiment and modification may be used as a light source 50 of a light emitting unit 5 as illustrated in FIGS. 12A and 12B according to an embodiment of the technology. FIG. 12A shows a planar configuration of the light emitting unit 5, and FIG. 12B shows a cross-sectional configuration thereof. In this light emitting unit 5, a plurality of the light sources 50 are disposed on a driving section 51. Light generated by the light sources 50 is so adjusted by a light reflection portion 52 as to have a desired light distribution property, and then extracted. The number of the light source 50 (light emitting device) to be disposed to the light emitting unit 5 is not limited to two or more, and the number of the light source 50 (light emitting device) to be disposed to the light emitting unit 5 may be one in one embodiment.

Figure 13:
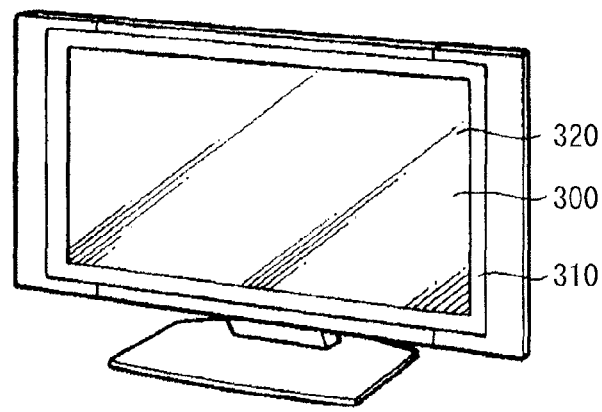
FIG. 13 is a perspective view showing an external appearance of an application example 1 of the light emitting unit illustrated in FIGS. 12A and 12B.

FIG. 13 shows an external appearance of a display to which the above-mentioned light emitting unit 5 is applied according to an embodiment of the technology. This display is provided with an image display screen section 300 which may include a front panel 310 and a filter glass 320, and the image display screen section 300 is configured of the light emitting unit according to the above-mentioned embodiment, for example.

Figure 14:
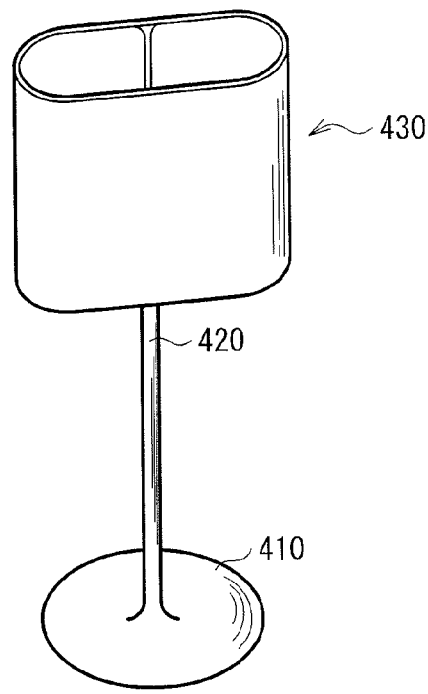
FIG. 14 is a perspective view showing an external appearance of an application example 2.
Figure 15:
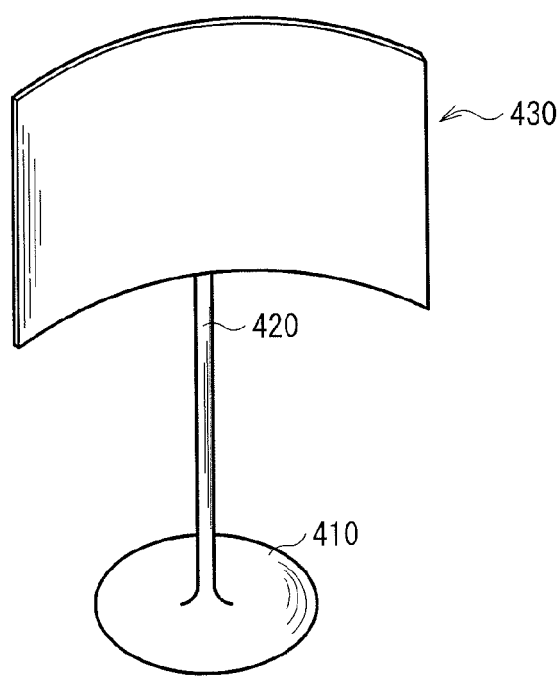
FIG. 15 is a perspective view showing an external appearance of an application example 3.

FIG. 14 and FIG. 15 each show an external appearance of a lighting apparatus to which the above-mentioned light emitting unit 5 is applied according to an embodiment of the technology. This lighting apparatus includes a lighting section 430 which may be mounted to a support pole 420 provided on a base 410, and the lighting section 430 is configured of the above-mentioned light emitting unit 5, for example.

Figure 16:
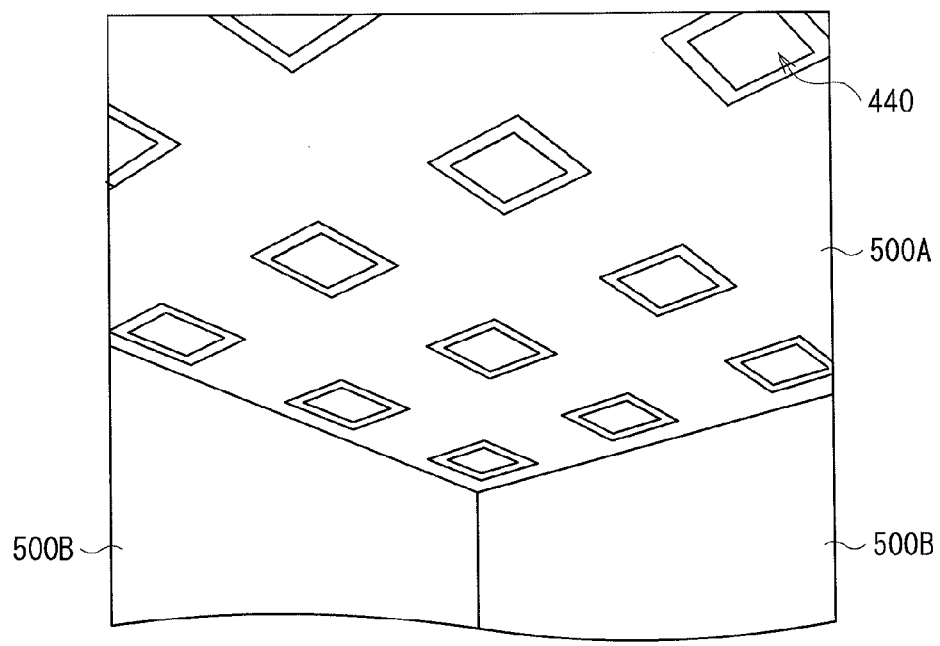
FIG. 16 is a perspective view showing an external appearance of an application example 4.

FIG. 16 shows an external appearance of a lighting apparatus for indoor use to which the above-mentioned light emitting unit 5 is applied according to an embodiment of the technology. This lighting apparatus has, for example, a lighting section 440 configured of the above-mentioned light emitting unit 5. Any number of the lighting sections 440 may be disposed on a ceiling 500A of a building at any intervals. It is to be noted that, instead of the ceiling 500A, the lighting section 440 may be installed at any places such as a wall 500B and a floor (not illustrated) as necessary. Furthermore, the above-mentioned light emitting unit 5 may be applied to any device that utilizes light such as an indicator in one embodiment.

Hereinabove, while the present technology has been described with reference to the example embodiment and the example modification, the present technology is not limited to the above-mentioned embodiment and so forth, and various modifications may be made. For example, while in the above-mentioned embodiment the laminated body 10 has a quadrangular-prism shape, the laminated body 10 may have any other suitable shape such as a cylindrical shape and a tapered shape including a truncated cone shape. In addition, an insulating film having irregularity may be provided on the front surface of the p-type cladding layer 13.

Further, while the light emitting layer 12 is formed with use of Al, In, Ga, P, and As-based materials (light emitting device of red to yellow-green) in the above-mentioned embodiment and so forth, the light emitting layer may be made of a material which includes one or more elements such as Al, In, Ga, and N and generates blue to green light (a light emitting device of blue having an emission wavelength of about 430 nm to about 550 nm both inclusive, for example).

Additionally, for example, the materials and thicknesses, the formation methods, and the formation conditions of the components described in the above-mentioned embodiment and so forth are not limitative. Other materials and thicknesses, other formation methods, and other formation conditions may also be adopted. For example, it is also possible to manufacture the components by changing on an as-necessary basis the order of formations thereof described in the above-mentioned embodiment and so forth.

Furthermore, while light is extracted from the top surface side of the p-type cladding layer 13 in the above-mentioned embodiment and so forth, light may be extracted from the bottom surface side of the n-type cladding layer 11.

Accordingly, it is possible to achieve at least the following configurations from the above-described example embodiments, the modifications, and the application examples of the disclosure.

(1) A light emitting device, including:
a laminated body including a first-conductivity type semiconductor layer, a light emitting layer, and a second-conductivity type semiconductor layer in this order;
a contact layer provided in contact with the second-conductivity type semiconductor layer at least at a peripheral edge of the second-conductivity type semiconductor layer;
a first electrode electrically connected to the first-conductivity type semiconductor layer;
a second electrode provided nearer to the first-conductivity type semiconductor layer than the second-conductivity type semiconductor layer; and a conductor electrically connecting the second electrode and the contact layer to each other.
(2) The light emitting device according to (1), wherein the conductor is provided on a side surface of the laminated body.
(3) The light emitting device according to (1) or (2), further including an insulating film provided between the conductor and the laminated body.
(4) The light emitting device according to any one of (1) to (3), wherein
a light extraction face is provided on a top surface of the second-conductivity type semiconductor layer, and
the first electrode and the second electrode are provided at a bottom surface of the first-conductivity type semiconductor layer.
(5) The light emitting device according to any one of (1) to (4), wherein the conductor entirely covers the side surface of the laminated body.
(6) The light emitting device according to any one of (3) to (5), wherein the following expression (1) is satisfied:

$$2D_{31} \times \cos\theta_{31} = (m+1/2) \times \lambda/n_{31} \quad (1)$$

where $D_{31}$ is a thickness of the insulating film, $\theta_{31}$ is an incident angle, relative to the insulating film, of light generated at the light emitting layer, $\lambda$ is a wavelength of the light generated at the light emitting layer, $n_{31}$ is a refractive index of the insulating film, and m is an integer of 0 or more.
(7) The light emitting device according to any one of (3) to (6), wherein
the insulating film is provided also between the second electrode and the laminated body, and
the following expression (2) is satisfied:

$$2D_{31B} \times \cos\theta_{31B} = (m1+1/2) \times \lambda/n_{31} \quad (2)$$

where $D_{31B}$ is a thickness of the insulating film between the laminated body and the second electrode, $\theta_{31B}$ is an incident angle, relative to the insulating film and the second electrode, of the light generated at the light emitting layer, $\lambda$ is the wavelength of the light generated at the light emitting layer, $n_{31}$ is the refractive index of the insulating film, and m1 is an integer of 0 or more.
(8) The light emitting device according to any one of (1) to (4), wherein the conductor is provided on a part of a side surface of the laminated body.
(9) The light emitting device according to any one of (1) to (8), wherein the laminated body is a light-emitting diode.
(10) The light emitting device according to any one of (1) to (9), wherein the light emitting layer includes one or more elements of Al, In, Ga, P, and As, and generates light ranging from red to yellow-green.
(11) The light emitting device according to any one of (1) to (9), wherein the light emitting layer includes one or more elements of Al, In, Ga, and N, and generates light ranging from blue to green.
(12) The light emitting device according to any one of (1) to (11), wherein the contact layer is provided only at the peripheral edge of the second-conductivity type semiconductor layer.
(13) The light emitting device according to any one of (3) to (11), wherein
the contact layer includes an eaves portion provided at an outer part of the second-conductivity type semiconductor layer, and
the eaves portion has a width substantially equal to a sum of a thickness of the conductor and a thickness of the insulating film.
(14) A light emitting unit with a light emitting device, the light emitting device including:
a laminated body including a first-conductivity type semiconductor layer, a light emitting layer, and a second-conductivity type semiconductor layer in this order;
a contact layer provided in contact with the second-conductivity type semiconductor layer at least at a peripheral edge of the second-conductivity type semiconductor layer;
a first electrode electrically connected to the first-conductivity type semiconductor layer;
a second electrode provided nearer to the first-conductivity type semiconductor layer than the second-conductivity type semiconductor layer; and
a conductor electrically connecting the second electrode and the contact layer to each other.
(15) A method of manufacturing a light emitting device, the method including:
forming a laminated body and a contact layer, the laminated body including a first-conductivity type semiconductor layer, a light emitting layer, and a second-conductivity type semiconductor layer in this order, and the contact layer being formed at least at a peripheral edge of the second-conductivity type semiconductor layer;

forming a first electrode in a region nearer to the first-conductivity type semiconductor layer than the second-conductivity type semiconductor layer; and forming a second electrode and electrically connecting the second electrode and the contact layer to each other through a conductor, the second electrode being formed in the region nearer to the first-conductivity type semiconductor layer than the second-conductivity type semiconductor layer.

The present disclosure contains subject matter related to that disclosed in Japanese Priority Patent Application JP 2012-017660 filed in the Japan Patent Office on Jan. 31, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device, comprising:
a laminated body including a first-conductivity type semiconductor layer, a light emitting layer, and a second-conductivity type semiconductor layer in this order, the laminated body having oppositely facing top and bottom surfaces;
a contact layer on the top surface and in contact with the second-conductivity type semiconductor layer at least at a peripheral edge of the second-conductivity type semiconductor layer;
a first electrode carried on and overlapped by the bottom surface and electrically connected to the first-conductivity type semiconductor layer;
a second electrode carried on and overlapped by the bottom surface but electrically insulated from the first-conductivity type semiconductor layer; and
a conductor electrically connecting the second electrode and the contact layer to each other, the conductor extending along a side surface of the laminated body but separated from the light emitting layer and electrically insulated from the first-conductivity type semiconductor layer by an insulating layer.

2. The light emitting device according to claim 1, wherein the insulating layer extends between the conductor and a side of the laminated body.

3. The light emitting device according to claim 2, wherein the conductor entirely covers the side surface of the laminated body.

4. The light emitting device according to claim 2, wherein the following expression (1) is satisfied:

$$2D_{31} \times \cos \theta_{31} = (m+1/2) \times \lambda / n_{31} \quad (1)$$

where $D_{31}$ is a thickness of the insulating film, $\theta_{31}$ is an incident angle, relative to the insulating film, of light generated at the light emitting layer, $\lambda$ is a wavelength of the light generated at the light emitting layer, $n_{31}$ is a refractive index of the insulating film, and m is an integer of 0 or more.

5. The light emitting device according to claim 2, wherein:
the insulating film is provided also between the second electrode and the laminated body; and
the following expression (2) is satisfied $$2D_{31B} \times \cos \theta_{31B} = (m1+1/2) \times \lambda / n_{31} \quad (2)$$

where $D_{31B}$ is a thickness of the insulating film between the laminated body and the second electrode, $\theta_{31B}$ is an incident angle, relative to the insulating film and the second electrode, of the light generated at the light emitting layer, $\lambda$ is the wavelength of the light generated at the light emitting layer, $n_{31}$ is the refractive index of the insulating film, and m1 is an integer of 0 or more.

6. The light emitting device according to claim 2, wherein the contact layer includes an eaves portion provided at an outer part of the second-conductivity type semiconductor layer, and
the eaves portion has a width substantially equal to a sum of a thickness of the conductor and a thickness of the insulating film.

7. The light emitting device according to claim 1, wherein the top surface of the second-conductivity type semiconductor layer is a light extraction face.

8. The light emitting device according to claim 1, wherein the conductor is on a part of a side surface of the laminated body.

9. The light emitting device according to claim 1, wherein the laminated body is a light-emitting diode.

10. The light emitting device according to claim 1, wherein the light emitting layer includes one or more of Al, In, Ga, P, or As, and generates light in the range from red light to yellow-green light.

11. The light emitting device according to claim 1, wherein the light emitting layer includes one or more of Al, In, Ga, or N, and generates light in the range from blue light to green light.

12. The light emitting device according to claim 1, wherein the contact layer is only at the peripheral edge of the second-conductivity type semiconductor layer.

13. A light emitting unit with a light emitting device, the light emitting device comprising:
a laminated body including a first-conductivity type semiconductor layer, a light emitting layer, and a second-conductivity type semiconductor layer in this order, the laminated body having oppositely facing top and bottom surfaces;
a contact layer on the top surface and in contact with the second-conductivity type semiconductor layer at least at a peripheral edge of the second-conductivity type semiconductor layer;
a first electrode electrically carried on and overlapped by the bottom surface and electrically connected to the first-conductivity type semiconductor layer;
a second electrode carried on and overlapped by the bottom surface but electrically insulated from the first-conductivity type semiconductor layer; and
a conductor electrically connecting the second electrode and the contact layer to each other, the conductor extending along a side surface of the laminated body but separated from at least the light emitting layer and electrically insulated from the first-conductivity type semiconductor layer by an insulating layer.

14. A method of manufacturing a light emitting device, the method comprising:
forming a laminated body and a contact layer, the laminated body including a first-conductivity type semiconductor layer, a light emitting layer, and a second-conductivity type semiconductor layer in this order, the laminated body having oppositely facing top and bottom surfaces, and the contact layer being formed on the top surface at least at a peripheral edge of the second-conductivity type semiconductor layer;

forming a first electrode on and overlapped by the bottom surface and in electrical contact with the first-conductivity type semiconductor layer; and forming a second electrode carried on and overlapped by the bottom surface but insulated from the first-conductivity type semiconductor layer and electrically connecting the second electrode and the contact layer to each other via a conductor that extends along a side surface of the laminated body, the conductor being separated from at least the light emitting layer and electrically insulated from the first-conductivity type semiconductor layer by an insulating layer.

\* \* \* \* \*